United States Patent
Cho et al.

(10) Patent No.: US 7,050,344 B1
(45) Date of Patent: May 23, 2006

(54) FAILURE TEST METHOD FOR SPLIT GATE FLASH MEMORY

(75) Inventors: Chih-Hung Cho, Hsinchu (TW); Ming-Shiahn Tsai, Tainan (TW); Shih-Tse Hsu, Miaoli (TW); Lih-Wei Lin, Chiayi (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 10/904,342

(22) Filed: Nov. 4, 2004

(51) Int. Cl.
*G11C 7/00* (2006.01)

(52) U.S. Cl. ............ 365/201; 365/185.09; 365/185.28; 365/185.29; 365/185.33

(58) Field of Classification Search ........... 365/185.09, 365/185.14, 185.28, 185.29, 185.33, 200
See application file for complete search history.

(56) References Cited

U.S. PATENT DOCUMENTS

| | | | |
|---|---|---|---|
| 5,659,550 A * | 8/1997 | Mehrotra et al. | 714/721 |
| 6,355,524 B1 | 3/2002 | Tuan et al. | 438/257 |
| 6,515,923 B1 * | 2/2003 | Cleeves | 365/201 |
| 6,567,305 B1 * | 5/2003 | Nakamura | 365/185.11 |
| 6,584,018 B1 | 6/2003 | Tuan et al. | 365/185.28 |

* cited by examiner

*Primary Examiner*—Hoai V. Ho
(74) *Attorney, Agent, or Firm*—Jiang Chyun IP Office

(57) ABSTRACT

A failure test method of word line-bit line short circuit in a split gate flash memory is provided. A well leakage-current test is performed to identify a sector with a failed memory cell. After being programmed, memory cells in the sector undergo a first read operation to generate a first bit map of the sector. After being erased, these memory cells in the sector undergo a second read operation to generate a second bit map of the sector. The first bit map and the second bit map are overlaid to identify the actual address of the failed memory cell.

19 Claims, 12 Drawing Sheets

| $Q_{11}$ | $Q_{12}$ | $Q_{13}$ | $Q_{14}$ |
|---|---|---|---|
| $Q_{21}$ | $Q_{22}$ | $Q_{23}$ | $Q_{24}$ |
| $Q_{31}$ | $Q_{32}$ | $Q_{33}$ | $Q_{34}$ |
| $Q_{41}$ | $Q_{42}$ | $Q_{43}$ | $Q_{44}$ |

FIG. 6A

| $Q_{11}$ | $Q_{12}$ | $Q_{13}$ | $Q_{14}$ |
|---|---|---|---|
| $Q_{21}$ | $Q_{22}$ | $Q_{23}$ | $Q_{24}$ |
| $Q_{31}$ | $Q_{32}$ | $Q_{33}$ | $Q_{34}$ |
| $Q_{41}$ | $Q_{42}$ | $Q_{43}$ | $Q_{44}$ |

FIG. 6B

| $Q_{11}$ | $Q_{12}$ | $Q_{13}$ | $Q_{14}$ |
|---|---|---|---|
| $Q_{21}$ | $Q_{22}$ | $Q_{23}$ | $Q_{24}$ |
| $Q_{31}$ | $Q_{32}$ | $Q_{33}$ | $Q_{34}$ |
| $Q_{41}$ | $Q_{42}$ | $Q_{43}$ | $Q_{44}$ |

FIG. 6C

FAILURE TEST METHOD FOR SPLIT GATE FLASH MEMORY

BACKGROUND OF THE INVENTION

1. Field of the Invention

The present invention relates to a test method for a semiconductor device, and more particularly to a failure test method for a split gate flash memory.

2. Description of the Related Art

Flash memories can program, read and erase data for multiple times, and data stored therein can be maintained even if the power applied thereto is off. Therefore, flash memories have become the major non-volatile memory widely used in personal computers and electronic equipment.

A typical flash memory comprises a floating gate and a control gate. The floating gate and the control gate are separated by a dielectric layer. The floating gate and the substrate are separated by a tunnel oxide layer. During data erasing in the flash memory, since the amount of electrons ejected from the floating gate is difficult to control, the floating gate would over-eject the electrons with positive charges, called over-erasing. If the over-erasing is so serious that the channel under the floating gate is turned on when power is not applied on the control gate, the data stored in the memory will be erroneously judged. In order to solve the over-erasing issue, split gate flash memories are introduced, for example, in U.S. Pat. No. 6,584,018 and U.S. Pat. No. 6,355,524.

FIG. 1 is a schematic cross-sectional view showing a conventional split gate flash memory cell. Referring to FIG. 1, the split gate flash memory comprises a tunnel oxide layer 102, a floating gate 104, an inter-gate dielectric layer 106 and a control gate 108, sequentially stacked over a substrate 100, and also a select gate 112 on sidewalls of the floating gate 104 and the control gate 108 where they are separated by a dielectric layer 110. The select gate 112 and the substrate 100 are separated by a select gate dielectric layer 114. The source region 116 is formed in the substrate 100 and adjacent to a side of the floating gate 104 and the control gate 108. The drain region 118 is formed in the substrate 100 and adjacent to the select gate 112, i.e. the word line. The drain region 118 is electrically connected to the bit line 122 through the contact 120.

A disadvantage of this split gate flash memory cell is its vulnerability to defects, such as particles. Especially, defects or particles between the contact 120 and the select gate 112, i.e. the word line, would lead to a short circuit in the word line-bit line, bringing the whole sector to a breakdown. The short circuit in the word line-bit line is a main killer, which crashes the programming/erasing function of the memory. One single defect or particle may render the whole chip irreparable.

Generally, in the failure analysis of flash memories, DC analyzing equipment is used to locate defects. By detecting hot spots or light spots, defect locations can be identified. However, this method can only locate the defects, but cannot precisely identify the address of the word line-bit line short circuit, i.e. the main killer. Moreover, the conventional method requires a complicated analyzing process, and cannot easily, efficiently locate the defects.

SUMMARY OF THE INVENTION

Accordingly, the present invention is directed to a failure test method for a split gate flash memory for easily and efficiently locating failure spots by using present electrical analyzing equipment.

The present invention provides a failure test method for a split gate flash memory, adapted for locating a short circuit in a word line-bit line. The method comprises performing a well leakage-current test to identify a sector with a failed memory cell. A programming operation is performed for plural memory cells in this sector. A first read operation is performed on these memory cells to obtain a first bit map of the sector. An erasing operation is then performed on these memory cells in the sector. A second read operation is performed on these memory cells to obtain a second bit map of the sector. Then an overlaying step is performed to stack the first bit map and the second bit map to locate the failed cell in the sector.

According to the failure test method for a split gate flash memory in an embodiment of the present invention, the steps of the p-well leakage-current test, the programming test, the first read and the second read operations, the erasing operation, and the overlaying step can be performed in the same equipment.

According to the failure test method for a split gate flash memory in an embodiment of the present invention, the step of the p-well leakage-current test comprises: applying a first voltage to a p-well of the split gate flash memory, and applying a second voltage to word lines so that a current value detected from the sector with the failed cell is larger than that detected from a normal sector. Wherein, the first voltage is 8V, the second voltage is 2V, and the current detected from the normal sector is lower than 20 μA.

According to the failure test method for a split gate flash memory in an embodiment of the present invention, the step of programming the memory cells described above comprises, for each of the memory cells in the sector, applying a third voltage to word lines, applying a fourth voltage to control gates, and applying a fifth voltage to source regions to program the memory cells. Wherein, the third voltage is 2V, the fourth voltage is 10V, and the fifth voltage is 6V.

According to the failure test method for a split gate flash memory in an embodiment of the present invention, the first bit map shows a failed bit-line location in the sector. In the first bit map, the failed memory cell is identified as 0, and other memory cells which share a same bit line with the failed memory cell are identified as 1.

According to the failure test method for a split gate flash memory in an embodiment of the present invention, the step of performing the erasing operation on the memory cells in the sector described above comprises, for each of the memory cells in the sector, applying a sixth voltage to word lines, applying a seventh voltage to control gates, applying an eighth voltage to a p-well, and floating the source regions to erase the memory cells. Wherein, the sixth voltage is 2V, the seventh voltage is −10V, and the eighth voltage is 8V.

According to the failure test method for a split gate flash memory in an embodiment of the present invention, the second bit map shows a failed word-line location in the sector. In the second bit map, the failed memory cell is identified as 0, and other memory cells which share a same word line with the failed memory cell are identified as 0 or 1.

The present invention uses the electrically analyzing method. After identifying the sector with the failed memory cell, all memory cells in the sector are programmed and read to generate a bit map. The bit map shows the location of failed bit-line. Then, all memory cells in the sector are erased and read to generate another bit map. The bit map shows the failed word-line location. By overlaying these bit maps, the location of the word line-bit line short circuit can be identified. Since all of these steps described above are performed in the same equipment, the time for analyzing the memory can be reduced. In addition, the equipment can be a general electricity analyzing equipment, but not necessarily the DC analyzing equipment, such as EMMI, LC, or OBIRCH. Thus, the complicated analyzing process can be avoided. Moreover, the present invention uses current-analyzing measurements and functional measurements to identify locations of defects, and is, therefore, different from the conventional location-analyzing method.

The above and other features of the present invention will be better understood from the following detailed description of the embodiments of the invention that is provided in communication with the accompanying drawings.

BRIEF DESCRIPTION OF THE DRAWINGS

FIG. 6A is a bit map of a bit-line failure test.

FIG. 6B is a bit map of a word-line failure test.

FIG. 6C is a bit map by overlaying the bit map of the bit-line failure test and the bit map of the word-line failure test.

DESCRIPTION OF SOME EMBODIMENTS

Figure 1:
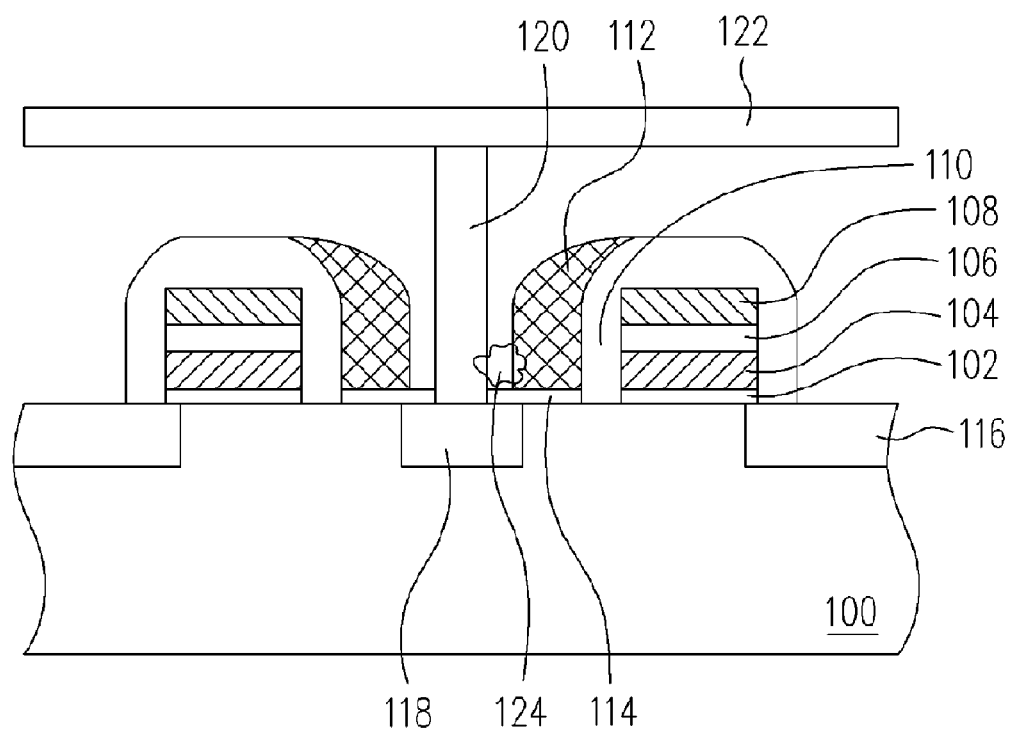
FIG. 1 is a schematic cross-sectional view showing a conventional split gate flash memory cell.
Figure 2:
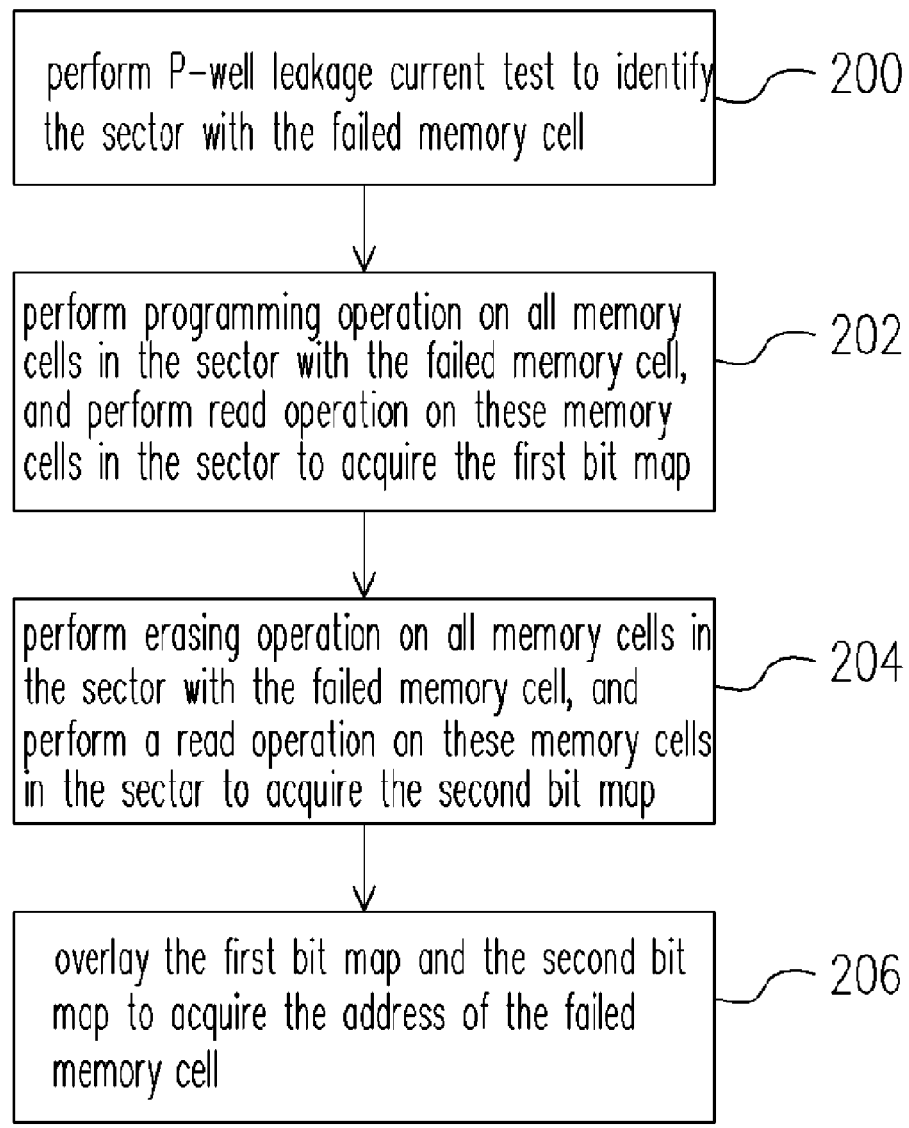
FIG. 2 is a flowchart showing a failure test method for a split gate flash memory according to an embodiment of the present invention.
Figure 3:
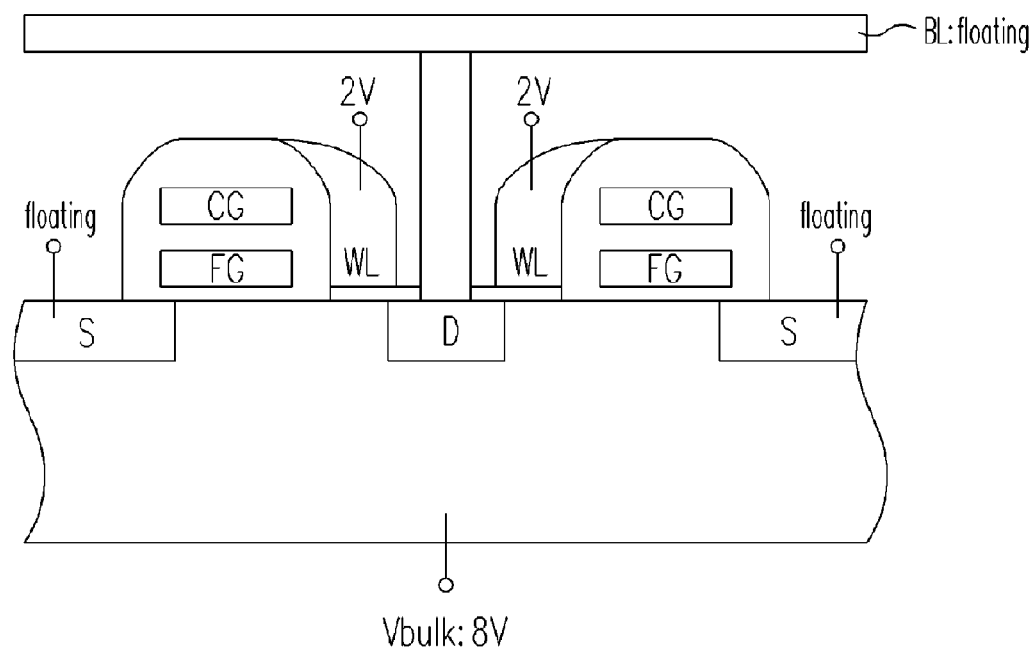
FIG. 3 is a schematic drawing showing an operation of a P-well leakage-current test for memory cells according to an embodiment of the present invention.

FIG. 2 is a flowchart showing a failure test method for a split gate flash memory according to an embodiment of the present invention. FIG. 3 is a schematic drawing showing an operation of a P-well leakage-current test for memory cells according to an embodiment of the present invention. In the following description, the failed memory cell is the memory cell where the word line-bit line short circuit occurs.

Referring to FIG. 2, the P-well leakage-current test is performed to identify the sector with the failed (defective) memory cell in the step 200. The P-well leakage-current test comprises, for example, applying 2V to the word line of the memory cell, and applying 8V to the substrate, i.e. the P-well, to measure current value of sectors as shown in FIG. 3. If a sector is a normal sector, the current measured is lower than 20 µA. When a sector contains a failed memory cell, a P-well leakage current is generated and the current measured is higher than 20 µA. For example, a sector with a failed memory cell may generate a 1000 µA leakage current. By this method, the sector with a failed memory cell can be identified.

Then, all memory cells in the sector with the failed memory cell are programmed. All memory cells in the sector are also read to generate a bit map in the step 202. Assuming that, before the memory cells are programmed, floating gates of these memory cells do not contain electrons, and these memory cells are identified as 1. After the memory cells are programmed, floating gates of these memory cells have electrons. These memory cells are identified as 0. By programming all memory cells in the sector, these memory cells should be identified as 0. These memory cells are then read to identify whether these memory cells are 1 or 0. When identified as 1, the memory cell is abnormal. Accordingly, in the bit map, the memory cell identified as 1 will be marked. In this step, since other normal cells sharing the same bit line with the failed memory cell are identified as 1 during the read operation, the bit map is able to show the failed bit-line location. The following is the description of identifying the failed word-line location in another bit map.

After all memory cells in the sector with the failed memory cell are erased, all the memory cells are read to generate another bit map in step 204. After the memory cells are erased, the floating gates of these memory cells do not have electrons, and these memory cells are identified as 1. By erasing all memory cells in the sector, all memory cells should be identified as 1. These memory cells in the sector are read to identify whether these memory cells are 0 or 1. When identified as 0, the memory cell is abnormal. In the bit map, the memory cell identified as 0 will be marked. In addition, since other normal memory cells sharing the same word line with the failed memory cell are identified as 0 or 1 during the read operation, the bit map shows the location of the failed word-line. During the erasing operation, if the erasing time is increased, the failed word-line location can be more accurate. The following is the description with respect to the bit map showing the word line-bit line short circuit.

These two bit maps are then overlaid to identify the location of the failed memory cell in the step 206. After acquiring the bit map with the failed bit-line location and the bit map with the failed word-line location in the sector with the failed memory cell, these two bit maps are overlaid and the address of the failed memory cell can be thus identified.

Figure 4:
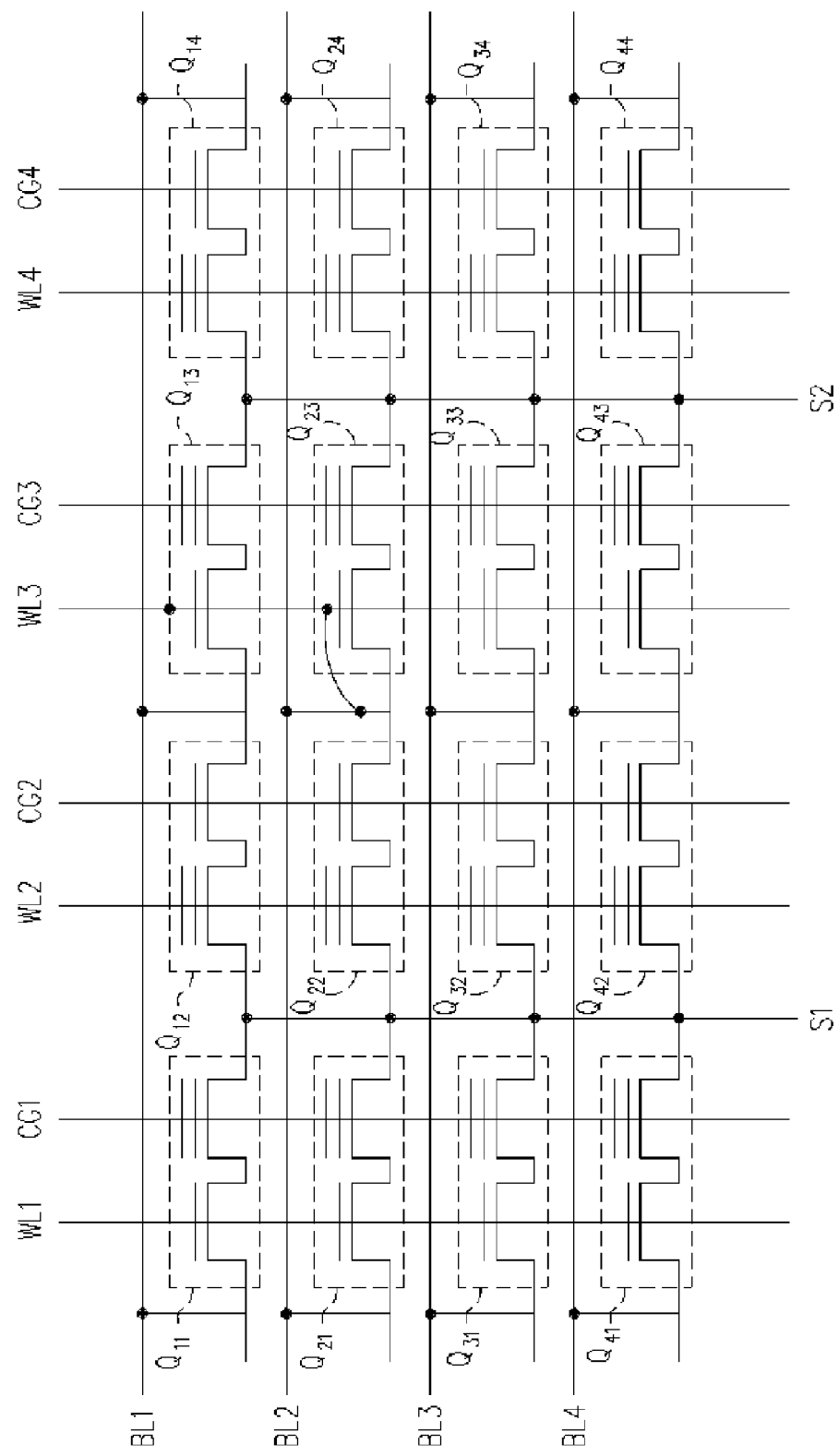
FIG. 4 is a schematic drawing showing a partial circuit of a sector in a split gate flash memory according to an embodiment of the present invention.

FIG. 4 is a schematic drawing showing a partial circuit of a sector of a split gate flash memory according to an embodiment of the present invention. FIGS. 5A–5M are schematic drawings showing failure test operations for memory cells of a split gate flash memory according to an embodiment of the present invention. FIG. 6A is a bit map of a bit-line failure test. FIG. 6B is a bit map of a word-line failure test. FIG. 6C is a bit map by overlaying the bit map of the bit-line failure test and the bit map of the word-line failure test. Table 1 shows the applied voltages for operations of the memory.

TABLE 1

|  |  | Read | Program | Erase |
|---|---|---|---|---|
| Word line | Selected | Vcc | 2 V | 2 V |
|  | Unselected | 0 V | 0 V | 2 V |
| Control gate | Selected | Vcc | 10 V | −10 V |
|  | Unselected | 0 V | 0 V | −10 V |
| Source line | Selected | 0 V | 6 V | Floating |
|  | Unselected | 0 V | 0 V | Floating |
| Bit line | Selected | <1.2 V | 0 V | Floating |
|  | Unselected | 0 V | Vcc | Floating |
| Bulk (Vbulk) |  | 0 V | 0 V | 8 V |

In FIG. 4, 16 memory cells $Q_{11}$–$Q_{44}$ are arranged in a NOR type array. FIG. 4 is used to explain the operational mechanism of the failure test method of the word line-bit line short circuit according to present invention, and uses 16 memory cells for a simple explanation. In some embodiments, the number of memory cells in a sector is more than 16. In this embodiment, the memory cell $Q_{23}$ serves as the memory cell where the word line-bit line short circuit occurs. That is, the word line WL3 and the bit line BL 2 are connected due to the short circuit. In addition, programming, reading and erasing for these memory cells are performed according to the voltages shown in Table 1.

During the read operation for these memory cells, current values detected from these memory cells are used to identify the states, 0 or 1, of these memory cells. If a floating gate of a memory cell does not have electrons, the current measured is higher and the memory cell is identified as 1. If a floating gate of a memory cell has electrons, the current measured is lower and the memory cell is identified as 0.

The following is the description with respect to an operational mechanism for obtaining the bit map with the bit-line failure as described in the step 202.

Figure 5A:
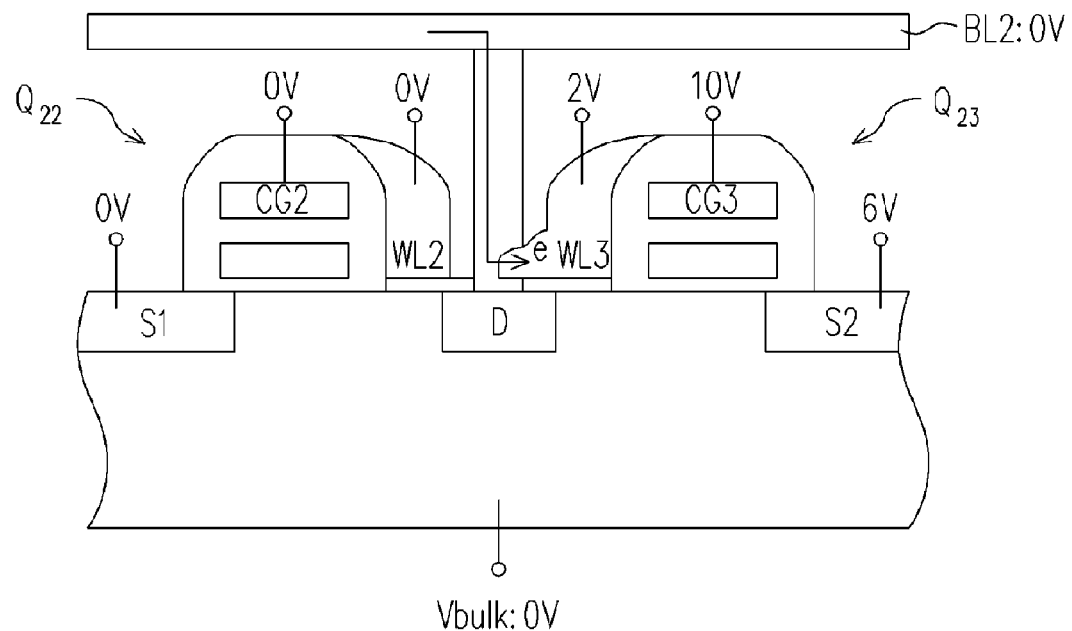
FIGS. 5A–5M are schematic drawings showing failure test operations on a short circuit in word line-bit line for memory cells in a split gate flash memory according to an embodiment of the present invention.

Referring to FIGS. 4 and 5A, during the programming of the memory cell $Q_{23}$, 2V is applied to the word line WL3, 10V is applied to the control gate CG3, and 6V is applied to the source region S2. Under such operational voltages, since the word line WL3 and the bit line BL2 are connected due to a short circuit, electrons flow from the bit line BL2 to the word line WL3, rather than into the floating gate. The programming of the memory cell $Q_{23}$ thus fails, and the memory cell $Q_{23}$ is identified as 1.

Figure 5B:
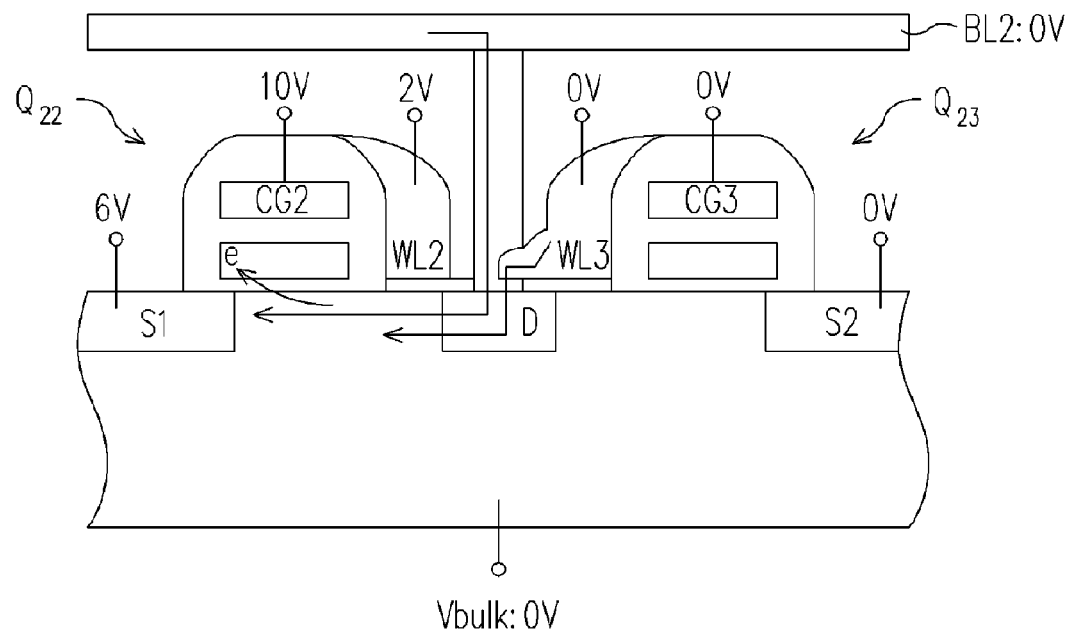

Referring to FIGS. 4 and 5B, during the programming of the memory cell $Q_{22}$, 2V is applied to the word line WL2, 10V is applied to the control gate CG2, and 6V is applied to the source region S1. Under such operational voltages, electrons, from the bit line BL2 or word line WL3, flow to the source region S1 through the drain region D and pass through the tunnel oxide layer to the floating gate of the memory cell $Q_{22}$ at the edge of the source region S1. Accordingly, the programming of the memory cell $Q_{22}$ is completed, and the memory cell $Q_{22}$ is identified as 0.

For memory cells $Q_{21}$ and $Q_{24}$, which share the same bit line BL2 with the $Q_{23}$, electrons can be injected into the floating gates of these memory cells during programming such that the programming of these memory cells are completed, and $Q_{21}$ and $Q_{24}$ are identified as 0.

Figure 5C:
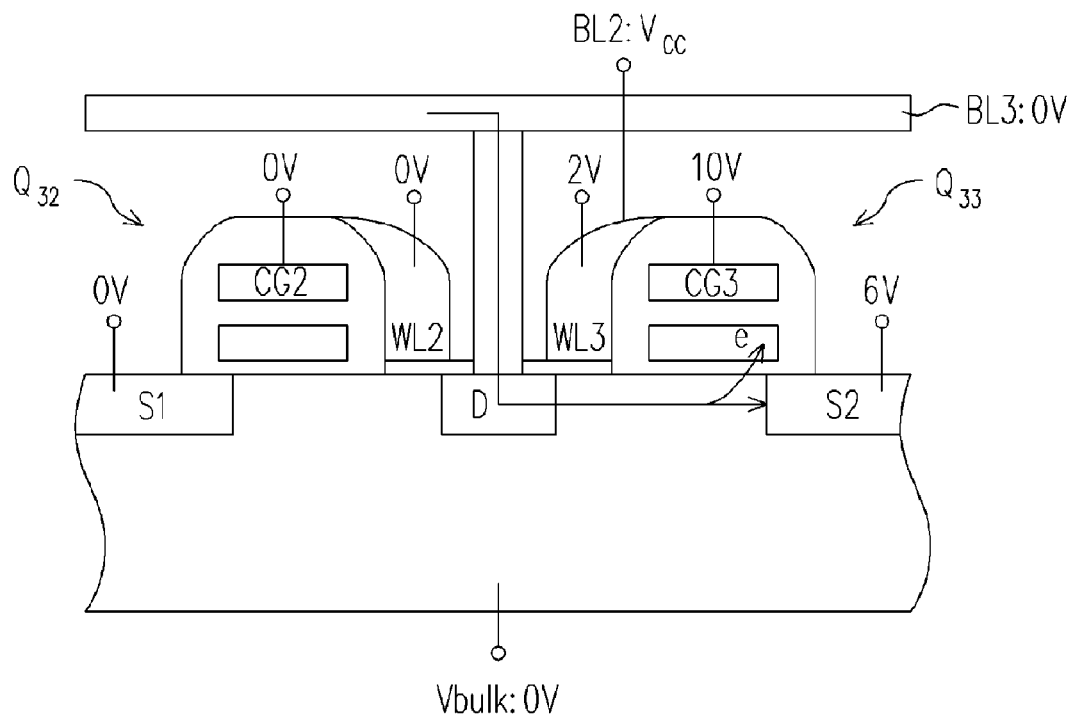

Referring to FIGS. 4 and 5C, during the programming of the memory cell $Q_{33}$, 2V is applied to the word line WL3, 10V is applied to the control gate CG3, and 6V is applied to the source region S2. Under such operational voltages, electrons, from the bit line BL3, flow to the source region S2 through the drain region D and pass through the tunnel oxide layer to the floating gate of the memory cell $Q_{33}$ at the edge of the source region S2. Accordingly, the programming of the memory cell $Q_{33}$ is completed, and the memory cell $Q_{33}$ is identified as 0. Though the word line WL 3 and the bit line BL2 are connected due to a short circuit, the voltage Vcc applied to the bit line BL2 only raises the voltage of the word line WL3 without affecting the programming of the memory cell $Q_{33}$.

Figure 5D:
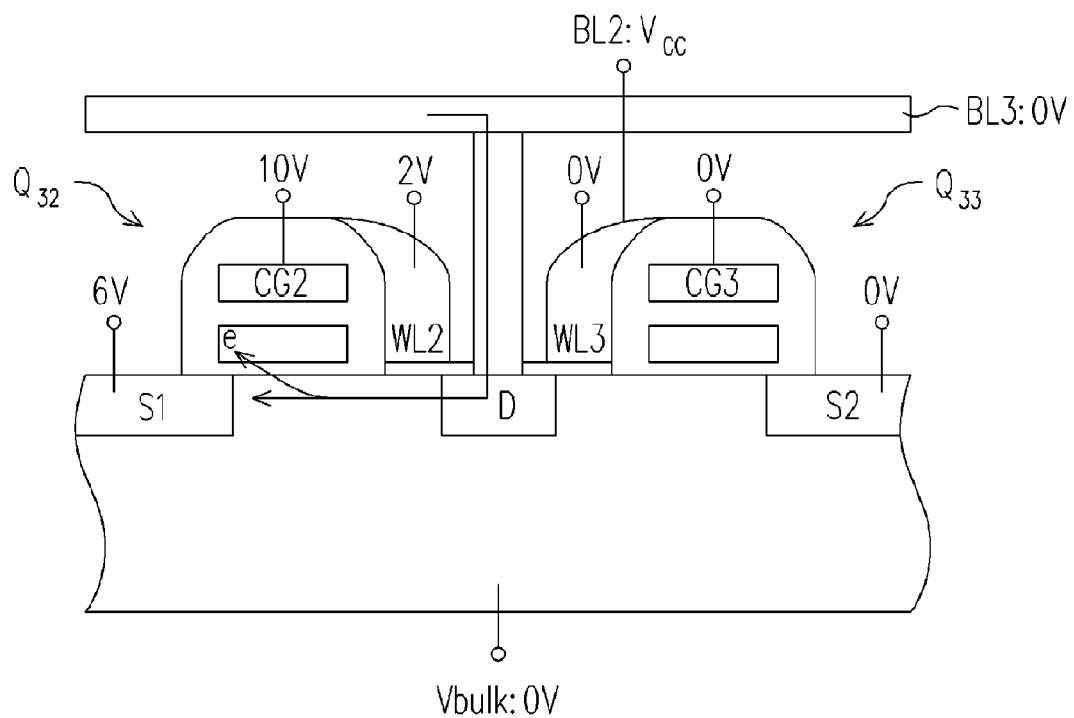

Referring to FIGS. 4 and 5D, during the programming of the memory cell $Q_{32}$, 2V is applied to the word line WL2, 10V is applied to the control gate CG2, and 6V is applied to the source region S1. Under such operational voltages, electrons, from the bit line BL3, flow to the source region S1 through the drain region D and pass through the tunnel oxide layer to the floating gate of the memory cell $Q_{32}$ at the edge of the source region S1. Accordingly, the programming of the memory cell $Q_{32}$ is completed, and the memory cell $Q_{32}$ is identified as 0. Though the word line WL 3 and the bit line BL2 are connected due to a short circuit, the programming of the memory cell $Q_{32}$ is not affected.

For memory cells $Q_{11}$–$Q_{14}$, $Q_{31}$, $Q_{34}$, and $Q_{41}$–$Q_{44}$, which do not share bit line BL 2 with the memory $Q_{23}$, electrons can be ejected into the floating gates of corresponding memory cells during programming. Accordingly, the programming of the memory cells $Q_{11}$–$Q_{14}$, $Q_{31}$, $Q_{34}$, and $Q_{41}$–$Q_{44}$ are completed, and these memory cells are identified as 0.

Figure 5E:
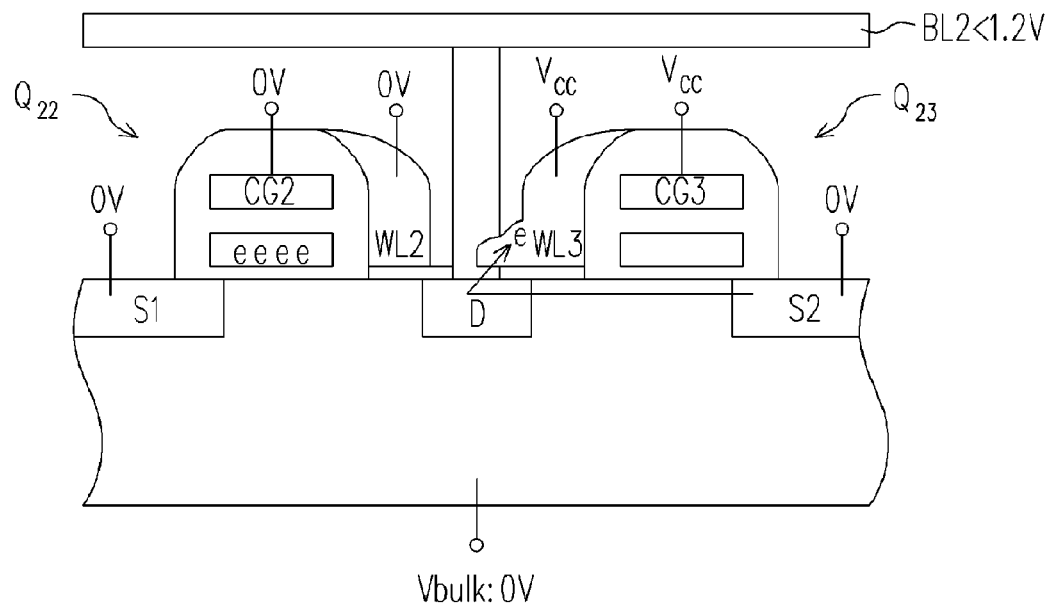

Referring to FIGS. 4 and 5E, when the memory cell $Q_{23}$ is read, Vcc is applied to the word line WL3, Vcc is applied to the control gate CG3, 0V is applied to the source region S2, and a voltage lower than 1.2V is applied to the bit line BL2. Since the word line WL3 and the bit line BL2 are short-circuited, electrons flow from the source region S2 into the word line WL3 through the drain region D and the bit line BL2. The read current becomes lower and the memory cell $Q_{23}$ is falsely identified as 0.

Figure 5F:
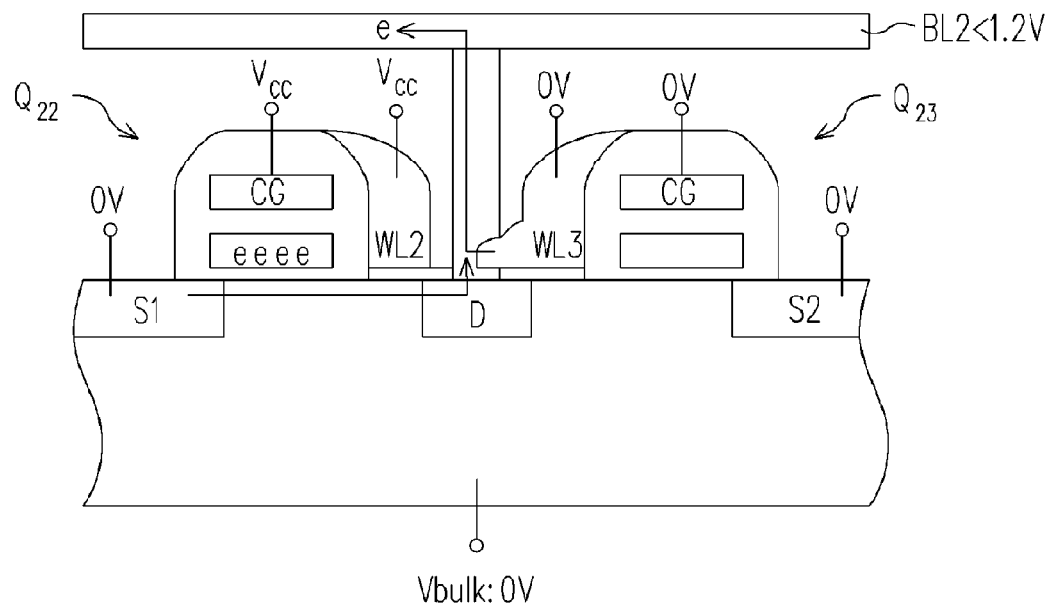

Referring to FIGS. 4 and 5F, when the memory cell $Q_{22}$ is read, Vcc is applied to the word line WL2, Vcc is applied to the control gate CG2, 0V is applied to the source region S1 and a voltage lower than 1.2V is applied to the bit line BL2. Since the word line WL3 and the bit line BL2 are short-circuited, electrons flow from the source region S1 into the bit line BL2 through the drain region D. Some electrons also flow from the word line WL3 to the bit line BL2. The read current becomes higher and the memory cell $Q_{22}$ is falsely identified as 1.

For memory cells $Q_{21}$ and $Q_{24}$, which share the same bit line BL2 with $Q_{23}$, during the read operation, some electrons also flow from the word line WL3 to the bit line BL2. Hence, the read current becomes higher and the memory cells $Q_{21}$ and $Q_{24}$ are falsely identified as 1.

Figure 5G:
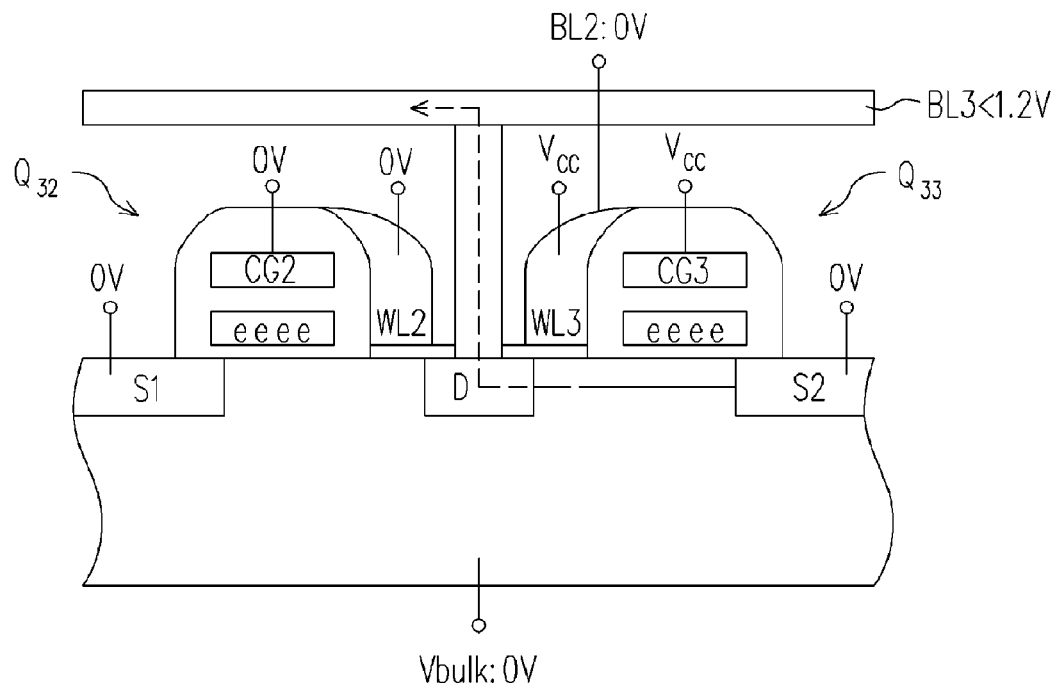

Referring to FIGS. 4 and 5G, when reading the memory cell $Q_{33}$, Vcc is applied to the word line WL3, Vcc is applied to the control gate CG3, 0V is applied to the source region S2 and a voltage lower than 1.2V is applied to the bit line BL3. Though the word line WL3 and the bit line BL2 are connected due to a short circuit, the voltage (0V) applied to the bit line BL2 only reduces the voltage of the word line WL3, and the read current becomes lower. Accordingly, the memory cell $Q_{33}$ is identified as 0.

Figure 5H:
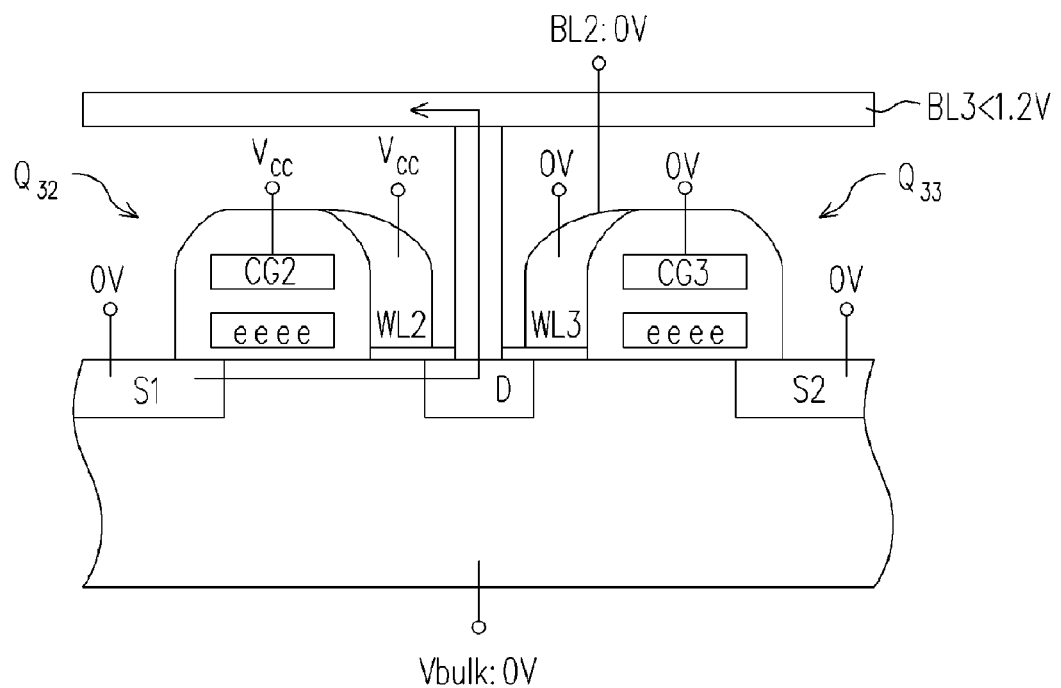

Referring to FIGS. 4 and 5H, when reading the memory cell $Q_{32}$, Vcc is applied to the word line WL2, Vcc is applied to the control gate CG2, 0V is applied to the source region S1 and a voltage lower than 1.2V is applied to the bit line BL3. Though the word line WL3 and the bit line BL2 are connected due to a short circuit, the memory cell $Q_{32}$ is not affected, and the read current becomes lower. Accordingly, the memory cell $Q_{32}$ is identified as 0.

For memory cells $Q_{11}$–$Q_{14}$, $Q_{31}$, $Q_{34}$, and $Q_{41}$–$Q_{44}$, which do not share bit line BL 2 with the memory $Q_{23}$, though the word line WL3 and the bit line BL2 are connected due to a short circuit, these memory cells are not affected, and the read currents become lower. Accordingly, the memory cells $Q_{11}$–$Q_{14}$, $Q_{31}$, $Q_{34}$, and $Q_{41}$–$Q_{44}$ are identified as 0.

Consequently, in the bit map generated by the equipment, except for the failed memory cell $Q_{23}$ being identified as 0, other memory cells $Q_{21}$, $Q_{22}$, and $Q_{23}$, which share the same bit line BL2 with the memory cell $Q_{23}$, are identified as 1 as shown in FIG. 6A. In addition, the memory cells $Q_{11}$–$Q_{14}$, $Q_{31}$–$Q_{34}$ and $Q_{41}$–$Q_{44}$, which do not share the same bit line BL 2 with the memory cell $Q_{23}$, are identified as 0. Accordingly, the failed bit-line address can be clearly identified in the bit map.

The following is the description with respect to an operational mechanism for obtaining the bit map with the word-line failure as described in the step 204.

Figure 5I:
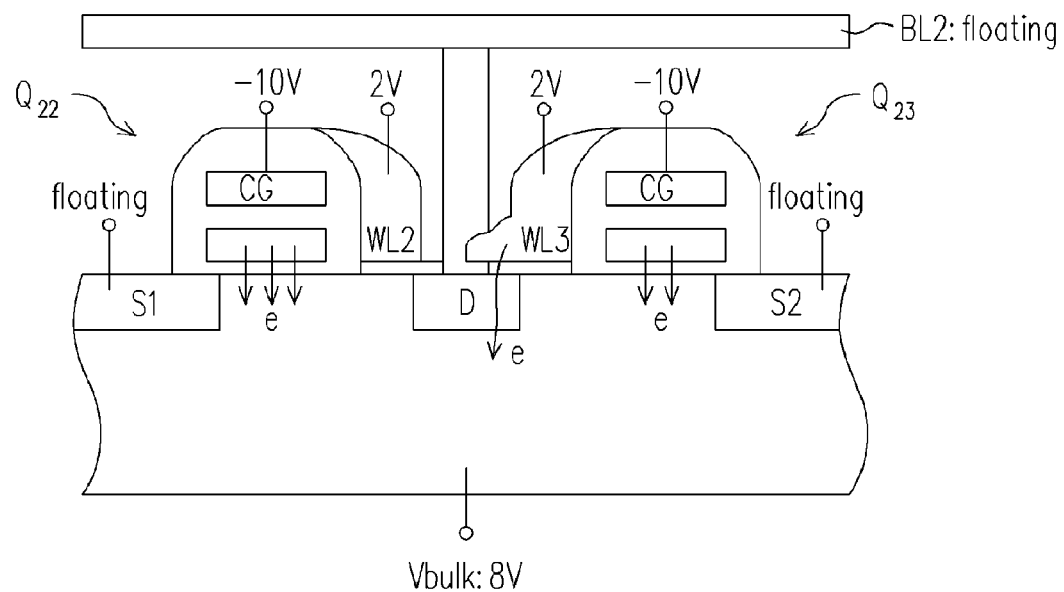

Referring to FIGS. 4 and 5I, during an erasing operation, all memory cells in the whole sector are erased. When erasing the memory cell $Q_{23}$, 2V is applied to the word line WL3, −10V is applied to the control gate CG3, the source region S2 and the drain region D are floating, and 8V is applied to the substrate (P-well). Under such operational voltages, since the word line WL3 and the bit line BL2 are connected due to a short circuit, electrons flow from the word line WL3 to the substrate, P-well, through the bit line BL2. The voltage drop between the control gate CG3 of the memory cell $Q_{23}$ and the substrate, the P-well, is not high enough for the memory cell $Q_{23}$ to be erased.

However, other memory cells $Q_{11}$–$Q_{41}$, $Q_{12}$–$Q_{42}$, $Q_{13}$, $Q_{33}$–$Q_{43}$, and $Q_{14}$–$Q_{44}$ can be normally erased. For example, when erasing the memory cell $Q_{22}$, 2V is applied to the word line WL2, −10V is applied to the control gate CG2, the source region S1 and the drain region D, i.e. bit line BL2, are floating, and 8V is applied to the substrate, P-well. Under such operational voltages, the voltage drop between the control gate CG2 of the memory cell $Q_{22}$ and the substrate, P-well, is sufficient to drive the electrons contained in the floating gate of the memory cell $Q_{22}$ passing through the tunnel oxide layer and into the substrate to be erased. Accordingly, the memory cell $Q_{22}$ is erased.

Figure 5J:
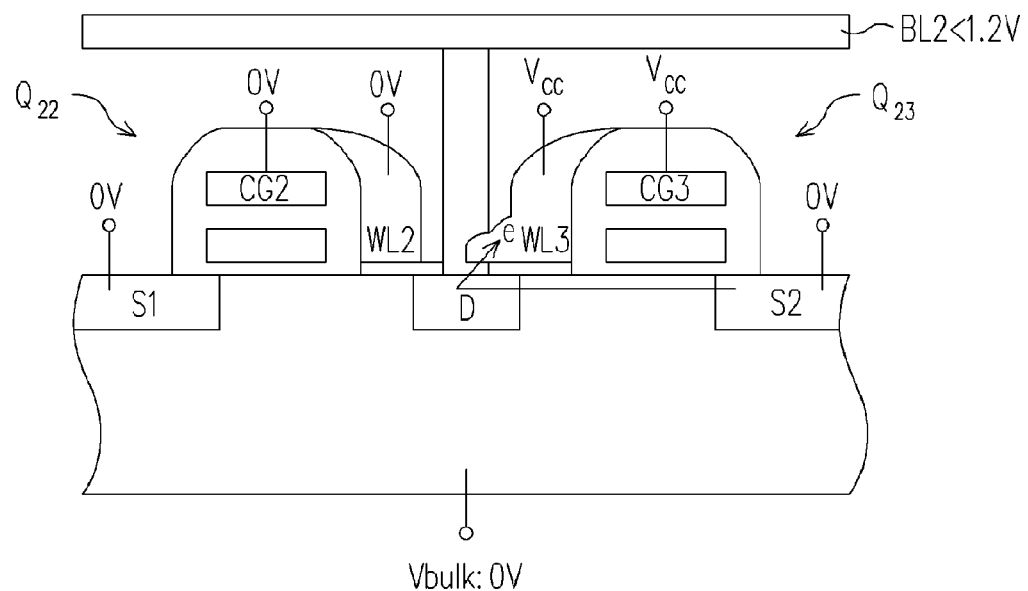

Referring to FIGS. 4 and 5J, when reading the memory cell $Q_{23}$, Vcc is applied to the word line WL3, Vcc is applied to the control gate CG3, 0V is applied to the source region S2, and a voltage lower than 1.2V is applied to the bit line BL2. Since the word line WL3 and the bit line BL2 are connected due to a short circuit, electrons flow from the source region S2 into the word line WL3 through the drain region D and the bit line BL2. The read current becomes lower and the memory cell $Q_{23}$ is falsely identified as 0. Accordingly, for the memory cell with the word line-bit line short circuit failure, the memory cell will be identified as 0 regardless of the programming or erasing status.

Figure 5K:
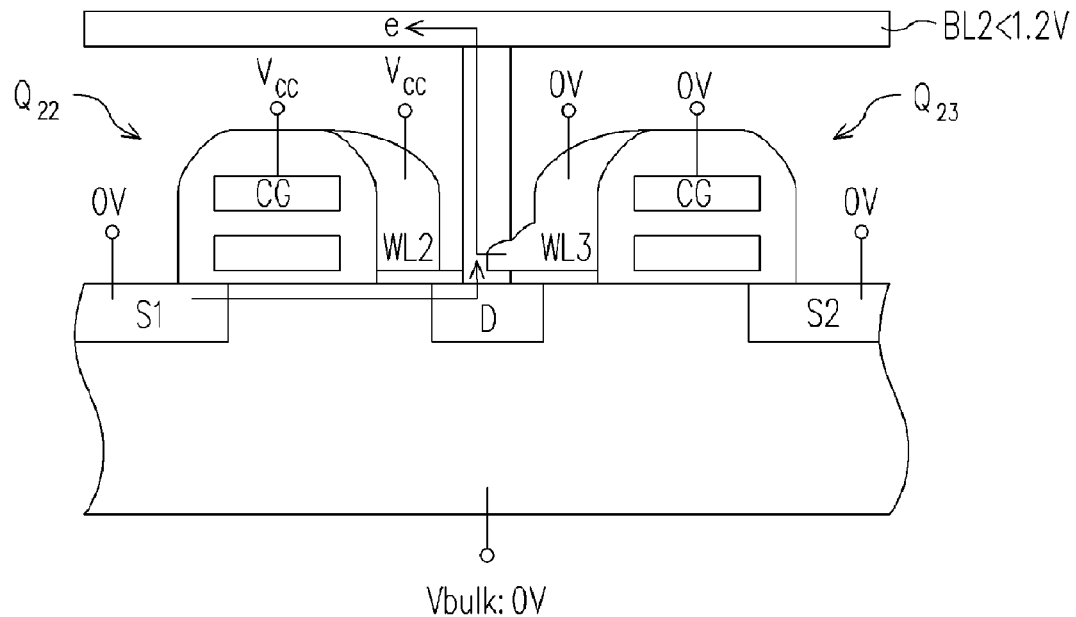

Referring to FIGS. 4 and 5K, when reading the memory cell $Q_{22}$, Vcc is applied to the word line WL2, Vcc is applied to the control gate CG2, 0V is applied to the source region S1 and a voltage lower than 1.2V is applied to the bit line BL2. When electrons flow from the source region S1 into the bit line BL2 through the drain region D, since the word line WL3 and the bit line BL2 are connected due to a short circuit, some electrons also flow from the word line WL3 to the bit line BL2 and the read current becomes higher and the memory cell $Q_{22}$ is falsely identified as 1. Accordingly, for the memory cell sharing the same bit line with the defective cell $Q_{23}$, the memory cell is identified as 1 regardless of the programming or erasing status.

Figure 5L:
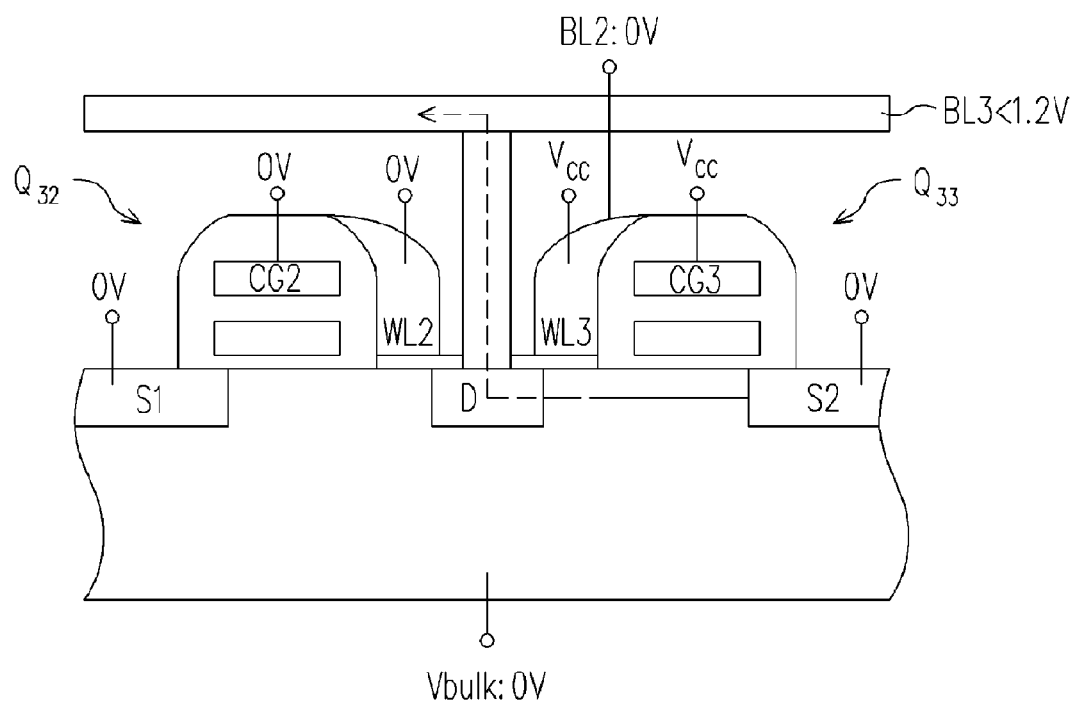

Referring to FIGS. 4 and 5L, when reading the memory cell $Q_{33}$, Vcc is applied to the word line WL3, Vcc is applied to the control gate CG3, 0V is applied to the source region S2 and a voltage lower than 1.2V is applied to the bit line BL3. Since the word line WL3 and the bit line BL2 are connected due to a short circuit, the voltage (0V) applied to the bit line BL2 reduces the voltage of the word line WL3, and the read current becomes uncertainly lower or higher. Accordingly, the memory cell $Q_{33}$ will be identified as 0 or 1. The memory cell $Q_{33}$ thus cannot be correctly identified.

Similarly, for these memory cells $Q_{13}$, $Q_{33}$ and $Q_{43}$, which share the same word line WL3 with the memory cell $Q_{23}$, since the word line WL3 and the bit line BL2 are connected due to a short circuit, the voltage (0V) applied to the bit line BL2 also reduces the voltage of the word line WL3, thus the memory cells $Q_{13}$, $Q_{33}$ and $Q_{43}$ cannot be correctly identified.

Figure 5M:
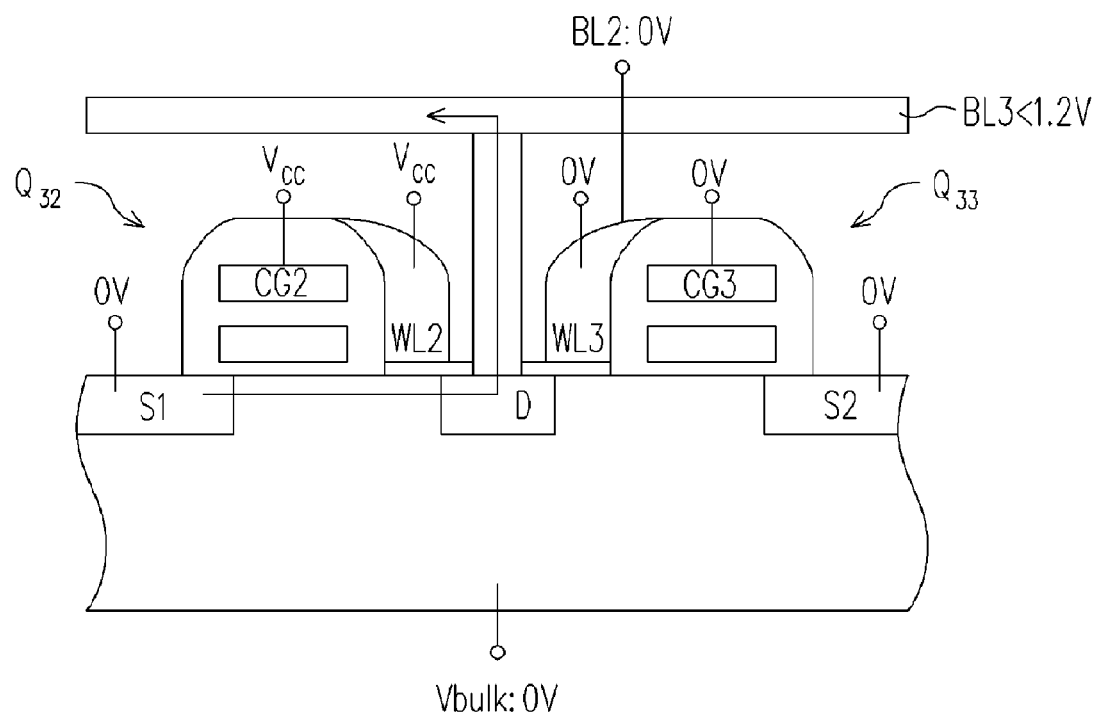

Referring to FIGS. 4 and 5M, when reading the memory cell $Q_{32}$, VCC is applied to the word line WL2, Vcc is applied to the control gate CG2, 0V is applied to the source region S1 and a voltage lower than 1.2V is applied to the bit line BL3. Though the word line WL3 and the bit line BL2 are connected due to a short circuit, the memory cell $Q_{32}$ is not affected, and the read current becomes higher. Accordingly, the memory cell $Q_{32}$ is identified as 1.

For memory cells $Q_{11}$–$Q_{41}$, $Q_{12}$–$Q_{42}$, and $Q_{14}$–$Q_{44}$, though the word line WL3 and the bit line BL2 are connected due to a short circuit, the memory cells $Q_{11}$–$Q_{41}$, $Q_{12}$–$Q_{42}$, and $Q_{14}$–$Q_{44}$ are not affected, and the read currents become higher. Accordingly, the memory cells $Q_{11}$–$Q_{41}$, $Q_{12}$–$Q_{42}$, and $Q_{14}$–$Q_{44}$ are identified as 1.

The bit map generated by the equipment is shown in FIG. 6B. As shown in FIG. 6B, since the failed memory cell $Q_{23}$ is identified as 0, other memory cells $Q_{13}$, $Q_{33}$ and $Q_{43}$, which share the same word line WL3 with the failed memory cell $Q_{23}$, may be identified as 0. The other memory cells $Q_{11}$–$Q_{41}$, $Q_{12}$–$Q_{42}$, and $Q_{14}$–$Q_{44}$, however, are identified as 1. Accordingly, the failed word-line address can be correctly identified in the bit map.

The bit map shown in FIG. 6A and the bit map shown in FIG. 6B are overlaid by the equipment. As shown in FIG. 6C, the overlapping area of the failed bit-line address and the failed word-line address is the location of the failed memory cell. By using the method of the present invention, the address of the word line-bit line with short circuit failure can be correctly identified.

The present invention uses the electrically analyzing method. After identifying the sector with the failed memory cell, all memory cells in the sector are programmed and read to generate a bit map. The bit map shows the failed bit-line address. Then, all memory cells in the sector are erased and read to generate another bit map. The bit map shows the failed word-line address. By overlaying these bit maps, the address of the word line-bit line short circuit can be identified. Since all of these steps described above are performed in the same equipment, the time for analyzing the memory can be reduced. In addition, the equipment can be general electrically analyzing equipment, and not necessarily the DC analyzing equipment, such as EMMI, LC, or OBIRCH. Thus, the complicated analyzing process can be avoided. Moreover, the present invention uses current-analyzing measurement and functional measurement to identify locations of defects, and is, therefore, different from the conventional location-analyzing method.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A failure test method for a split gate flash memory, adapted for identifying a word line-bit line short circuit failure, the method comprising:

performing a well leakage-current test to identify a sector with a failed memory cell;

performing a programming operation on plural memory cells in the sector; performing a first read operation on the memory cells to obtain a first bit map of the sector;

performing an erasing operation on the memory cells in the sector; performing a second read operation on the memory cells to obtain a second bit map of the sector; and overlaying the first bit map and the second bit map to identify a location of the failed cell in the sector.

2. The failure test method for a split gate flash memory of claim 1, wherein the steps of the well leakage-current test, the programming, the first read and the second read operations, the erasing operation, and the overlaying are performed in a same equipment.

3. The failure test method for a split gate flash memory of claim 1, wherein the step of the p-well leakage-current test comprises:

applying a first voltage to a well of the split gate flash memory, and applying a second voltage to word lines so that a current value detected from the sector with the failed cell is higher than a current detected from a normal sector.

4. The failure test method for a split gate flash memory of claim 3, wherein the first voltage is 8V, the second voltage is 2V, and the current detected from the normal sector is lower than 20 µA.

5. The failure test method for a split gate flash memory of claim 1, wherein the step of programming the memory cells comprises:

for each of the memory cells in the sector, applying a third voltage to word lines, applying a fourth voltage to control gates, and applying a fifth voltage to source regions to program the memory cells.

6. The failure test method for a split gate flash memory of claim 5, wherein the third voltage is 2V, the fourth voltage is 10V, and the fifth voltage is 6V.

7. The failure test method for a split gate flash memory of claim 1, wherein the first bit map shows a failed bit-line address in the sector.

8. The failure test method for a split gate flash memory of claim 7, wherein in the first bit map, the failed memory cell is identified as 0, and other memory cells which share a same bit line with the failed memory cell are identified as 1.

9. The failure test method for a split gate flash memory of claim 1, wherein the step of performing the erasing operation for the memory cells in the sector comprises:

for each of the memory cells in the sector, applying a sixth voltage to word lines, applying a seventh voltage to control gates, applying an eighth voltage to a well, and floating source regions to erase the memory cells.

10. The failure test method for a split gate flash memory of claim 9, wherein the sixth voltage is 2V, the seventh voltage is −10V, and the eighth voltage is 8V.

11. The failure test method for a split gate flash memory of claim 1, wherein the second bit map shows a failed word-line address in the sector.

12. The failure test method for a split gate flash memory of claim 11, wherein in the second bit map, the failed memory cell is identified as 0, and other memory cells which share a same word line with the failed memory cell are identified as 0 or 1.

13. A failure test method for a split gate flash memory, adapted for identifying a word line-bit line short circuit failure, the method comprising:

performing a well leakage-current test to identify a sector with a failed memory cell;

performing a programming operation on plural memory cells in the sector;

performing a first read operation on the memory cells to obtain a first bit map of the sector, wherein the first bit map shows a failed bit-line address in the sector;

performing an erasing operation on the memory cells in the sector;

performing a second read operation on the memory cells to obtain a second bit map of the sector, wherein the second bit map shows a failed word-line address of the sector; and performing an overlaying step to stack the first bit map and the second bit map to identify an address of the failed memory cell in the sector, wherein the steps of the well leakage-current test, the programming, the first read and the second read operations, the erasing operation, and the overlaying step are performed in a same equipment.

14. The failure test method for a split gate flash memory of claim 13, wherein the step of the p-well leakage-current test comprises:

applying a first voltage to a well of the split gate flash memory, and applying a second voltage to word lines so that a current value detected from the sector with the failed cell is higher than that detected from a normal sector.

15. The failure test method for a split gate flash memory of claim 14, wherein the first voltage is 8V, the second voltage is 2V, and the current detected from the normal sector is lower than 20 µA.

16. The failure test method for a split gate flash memory of claim 13, wherein the step of programming the memory cells comprises:

for each of the memory cells in the sector, applying a third voltage to word lines, applying a fourth voltage to control gates, and applying a fifth voltage to source regions to program the memory cells.

17. The failure test method for a split gate flash memory of claim 16, wherein the third voltage is 2V, the fourth voltage is 10V, and the fifth voltage is 6V.

18. The failure test method for a split gate flash memory of claim 13, wherein the step of performing the erasing operation on the memory cells in the sector comprises:

for each of the memory cells in the sector, applying a sixth voltage to word lines, applying a seventh voltage to control gates, applying an eighth voltage to a well, and floating source regions to erase the memory cells.

19. The failure test method for a split gate flash memory of claim 18 wherein the sixth voltage is 2V, the seventh voltage is −10V, and the eighth voltage is 8V.

* * * * *